United States Patent [19]
Noda et al.

[11] Patent Number: 5,095,352
[45] Date of Patent: Mar. 10, 1992

[54] SEMICONDUCTOR INTEGRATED CIRCUIT DEVICE OF STANDARD CELL SYSTEM

[75] Inventors: Makoto Noda, Yokohama; Kazuhiro Suda, Saitama, both of Japan

[73] Assignee: Kabushiki Kaisha Toshiba, Kawasaki, Japan

[21] Appl. No.: 737,846

[22] Filed: Jul. 30, 1991

Related U.S. Application Data

[63] Continuation of Ser. No. 451,786, Dec. 18, 1989, abandoned.

[30] Foreign Application Priority Data

Dec. 20, 1988 [JP] Japan .................. 63-321147

[51] Int. Cl.$^5$ .......................... H01L 27/10
[52] U.S. Cl. ...................... 357/45; 357/41; 357/68
[58] Field of Search .............. 357/41, 45 M, 45, 68, 357/71

[56] References Cited

U.S. PATENT DOCUMENTS 3,808,475  4/1974  Buelow et al. ................ 357/45

FOREIGN PATENT DOCUMENTS

| 0177336 | 1/1985 | European Pat. Off. | 357/45 |
|---|---|---|---|
| 58-037953 | 3/1983 | Japan | 357/41 |
| 58-90740 | 5/1983 | Japan | 357/71 |
| 59-111344 | 6/1984 | Japan | 357/71 |

OTHER PUBLICATIONS

Song et al., "Power Distribution Techniques for VLSI Circuits," IEEE Journal of Solid-State Circuits, vol. SC21, No. 1, pp. 150–156, Feb. 1986.

Primary Examiner—Jerome Jackson, Jr.
Assistant Examiner—Hung Xuan Dang
Attorney, Agent, or Firm—Finnegan, Henderson, Farabow, Garrett and Dunner

[57] ABSTRACT

A semiconductor integrated circuit device of a standard cell system of this invention includes a cell array constituted by linearly arranging a plurality of cells each having a predetermined unit logical function. A Vcc power supply line and a GND power supply line are formed of a first aluminum layer, to supply a power supply voltage to the cells in the cell arrays. Power supply buses formed of a second aluminum layer are arranged on both the ends of the Vcc power supply line and the GND power supply line through a via hole, in a direction perpendicular to the Vcc power supply line and the GND power supply line. A Vcc power supply line and a GND power supply line formed of a third aluminum layer are arranged on the Vcc power supply line and the GND power supply line, at a central portion of the cell array, through a via hole, and extend in the same direction as the Vcc power supply lines and the GND power supply line, both mode of the first aluminum layer. Two systems of GND power supply lines allow a decrease in current density.

13 Claims, 5 Drawing Sheets

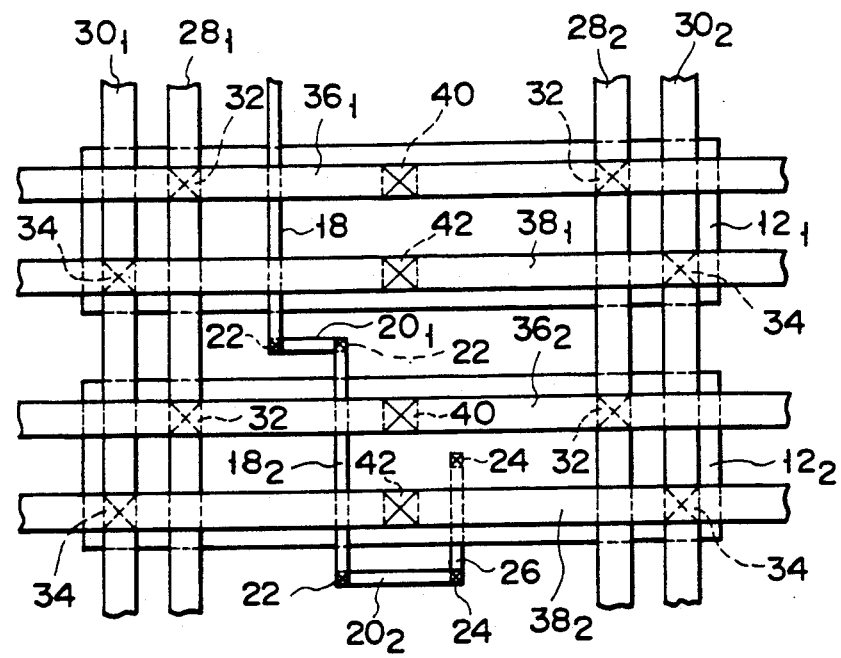
F I G. 4
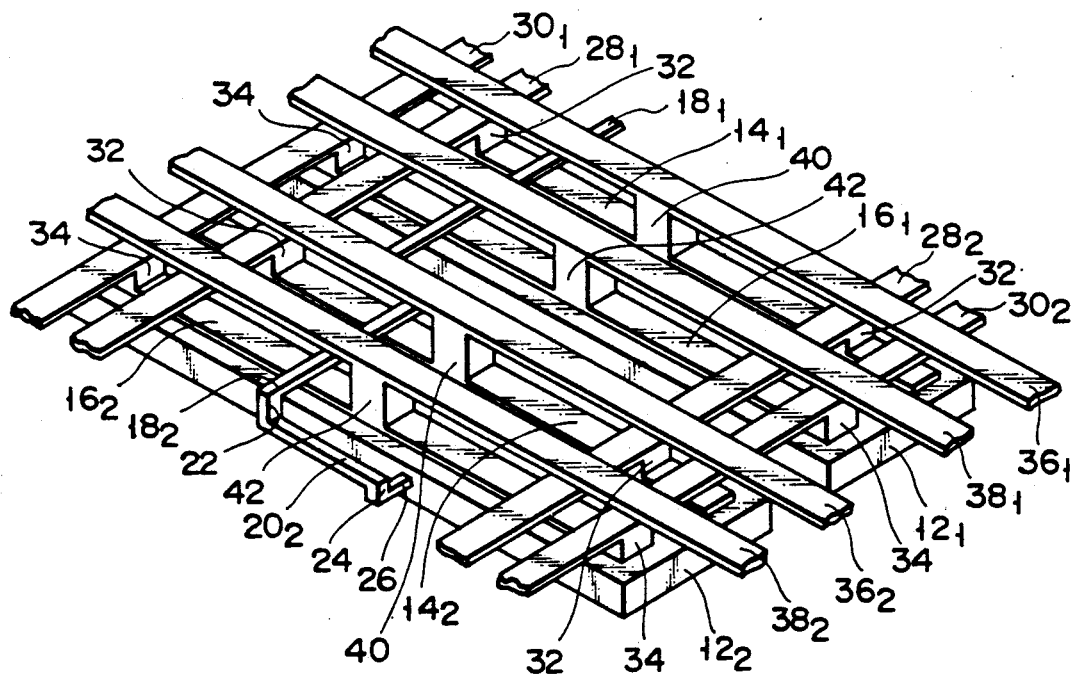
F I G. 5

SEMICONDUCTOR INTEGRATED CIRCUIT DEVICE OF STANDARD CELL SYSTEM

This application is a continuation of application Ser. No. 07/451,786 filed Dec. 18, 1989, now abandoned.

BACKGROUND OF THE INVENTION

1. Field of the Invention

The present invention relates to a semiconductor device and, more particularly, to a semiconductor integrated circuit device of a standard cell system having improved power supply lines using three or more wiring layers.

2. Description of the Related Art

In recent years, micropatterning of elements has been rapidly developing as semiconductor process techniques are improved, and the number of elements integrated in one chip has been increased. As a result, the period required for designing a large scale integrated circuit has been undesirably increased. In order to shorten the designing period, a method of designing a standard cell system has been widely employed.

When an integrated circuit is designed according to a standard cell, a cell library including basic gates (such as an inverter, a NAND gate, and a flip-flop) pattern-designed in advance is used, and cells in the cell library are automatically arranged and wired by a computer in accordance with logical net list of the integrated circuit to obtain a desired layout of the integrated circuit. As described above, this design method for an integrated circuit using a standard cell system has the feature that the period required for layout is extremely short because cells designed in advance and registered as a cell library are used, and because the actual wiring operation is automatically performed by computer.

FIGS. 1 and 2 show a semiconductor integrated circuit device of a standard cell system according to the prior art, in which FIG. 1 is a plan view, and FIG. 2 is a perspective view of the device in FIG. 1. A plurality of cell arrays which are designed in advance ar aligned by a computer in accordance with logical connection data. Spaces between the cell arrays serve as wiring channels, and the cells are wired utilizing the wiring channels, thus constituting a predetermined integrated circuit. Only two standard cell arrays $12_1$ and $12_2$ are shown in FIGS. 1 and 2, for the sake of descriptive simplicity.

In this integrated circuit, a Vcc power supply line for supplying a power supply voltage to each standard cell in the standard cell arrays $12_1$ and $12_2$, and a GND power supply line to be grounded are arranged as follows.

When standard cells are arranged in one line to constitute a cell array, Vcc and GND power supply lines in a first aluminum (Al) layer which are designed in advance in the respective standard cells are arranged such that the Vcc power supply lines of adjacent standard cells are connected to each other, and the GND power supply lines of adjacent standard cells are also connected to each other. In FIG. 1, the Vcc and GND power supply lines in the standard cells are connected in the cell arrays $12_1$ and $12_2$ to form Vcc power supply lines $14_1$ and $14_2$ in the cell arrays, and GND power supply lines $16_1$ and $16_2$ in the cell arrays.

Signal lines are wired to the standard cells as follows. For example, a second aluminum (Al) layer is formed with first signal lines $18_1$ and $18_2$ in a direction perpendicular to the Vcc power supply lines $14_1$ and $14_2$ and the GND power supply lines $16_1$ and $16_2$. The first Al layer is formed with second signal lines $20_1$ and $20_2$ along the standard cell arrays $12_1$ and $12_2$. The second signal lines $20_1$ and $20_2$ are connected to the first signal lines $18_1$ and $18_2$ through via holes 22. The second signal line $20_2$ is connected to a polysilicon wiring layer 26 through a contact hole 24. The polysilicon wiring layer 26 is connected to one of the standard cells having a predetermined logical function. A supply bus for supplying a power supply voltage is arranged to operate the standard cells in the standard cell arrays $12_1$ and $12_2$. More specifically, the second Al layer is formed with Vcc power supply buses $28_1$ and $28_2$ and GND power supply buses $30_1$ and $30_2$—all made from the second Al layer—are arranged in a direction perpendicular to the Vcc power supply lines $14_1$ and $14_2$ and the GND power supply lines $16_1$ and $16_2$. These buses $28_1$, $28_2$, $30_1$, and $30_2$ are connected to the Vcc power supply lines $14_1$ and $14_2$ and the GND power supply lines $16_1$ and $16_2$ at the both ends thereof through via holes 32 and 34.

A current path of the semiconductor integrated circuit device of the standard cell system with the above arrangement is schematically shown in FIG. 3. In FIG. 3, a current from, e.g., the GND power supply line $16_2$ is supplied to the GND power supply buses $30_1$ and $30_2$ through the via holes 34, as indicated by arrows. Similarly, a current from the GND power supply line $16_1$ is supplied to the GND power supply buses $30_1$ and $30_2$ through the via holes 34.

In the above-mentioned integrated circuit of a standard cell system according to the prior art, when a large scale circuit is arranged, the number of cells arranged in one cell array is increased, and a current which flows through the power supply lines in the cell array is increased, thus causing electromigration. Since the width of each power supply line arranged in the cell is designed in advance and fixed, the number of cells arranged in one cell array is limited so that the current has an allowable density or less of a current which can flow through the power supply line.

When a high-speed operation for decreasing the scale of an integrated circuit is achieved by a scaling operation using a designed standard cell library, the width of the power supply line in the cell array is decreased, and hence the current density of current in the supply line is increased, thus causing electromigration.

Note that electromigration is a phenomenon by which a void or a hillock is formed in a metal layer when metal ions in the metal wiring layers are moved under the condition of a large current density, thus finally causing disconnection or short-circuiting of the lines. The service life of each line is adversely affected, and the service life of the integrated circuit device is shortened.

In order to solve the above problem, each line must be reinforced to withstand a large current density. For example, when the widths (patterns) of the Vcc power supply buses $28_1$ and $28_2$ and the GND power supply buses $30_1$ and $30_2$ arranged on the standard cell arrays $12_1$ and $12_2$ are increased, the above problem can be solved.

However, if the widths of the Vcc power supply lines $14_1$ and $14_2$ and the GND power supply lines $16_1$ and $16_2$ arranged in the standard cell arrays $12_1$ and $12_2$ are similarly increased, logic patterns in the standard cells are adversely affected. More specifically, when the pattern power supply lines are made broader, the standard cells will become larger, inevitably reducing the integration density of the circuit. An increase in the width of these lines is a bar to the enhancement of the integration density.

SUMMARY OF THE INVENTION

It is, therefore, an object of the present invention to provide a high-integration, high-reliability semiconductor integrated circuit device having a long circuit life, which can minimize the adverse effect due to electromigration caused by an increase in current density in wiring layers upon micropatterning of the integrated circuit.

According to an aspect of the present invention, there is provided a semiconductor integrated circuit device of a standard cell system, comprising a cell array constituted by linearly arranging a plurality of cells each having a predetermined unit logical function, a first power supply line, which is connected to each of the cells to supply a power supply voltage to each cell in the cell array, is formed of a first conductor layer, and elongated in a first direction; a second power supply line, which is electrically connected to the first power supply line, is formed of a second conductor layer on the first power supply line, and is elongated in a second direction, perpendicular to that of the first power supply line; and a third power supply line, which is electrically connected to the first power supply line to supply a power supply voltage to each of the cells in the cell array, is formed of a third conductor layer on the second conductor layer, and is elongated in a third direction, perpendicular to that of the second power supply line.

BRIEF DESCRIPTION OF THE DRAWINGS

These and other features and advantages of the present invention will become more apparent from the following detailed description of exemplary embodiments illustrated in the accompanying drawings in which:

FIGS. 1 and 2 show a semiconductor integrated circuit device of a standard cell system according to the prior art, in which FIG. 1 is a plan view, and FIG. 2 is a three-dimensional perspective view of the device in FIG. 1;

FIGS. 4 and 5 show a semiconductor integrated circuit device of a standard cell system according to an embodiment of the present invention, in which FIG. 4 is a plan view, and FIG. 5 is a three-dimensional perspective view showing the device in FIG. 4;

FIGS. 8 and 9 show a semiconductor integrated circuit device of a standard cell system according to still another embodiment of the present invention, in which FIG. 8 is a plan view, and FIG. 9 is a three-dimensional perspective view of the device in FIG. 8.

DETAILED DESCRIPTION OF THE PREFERRED EMBODIMENTS

Figure 1:
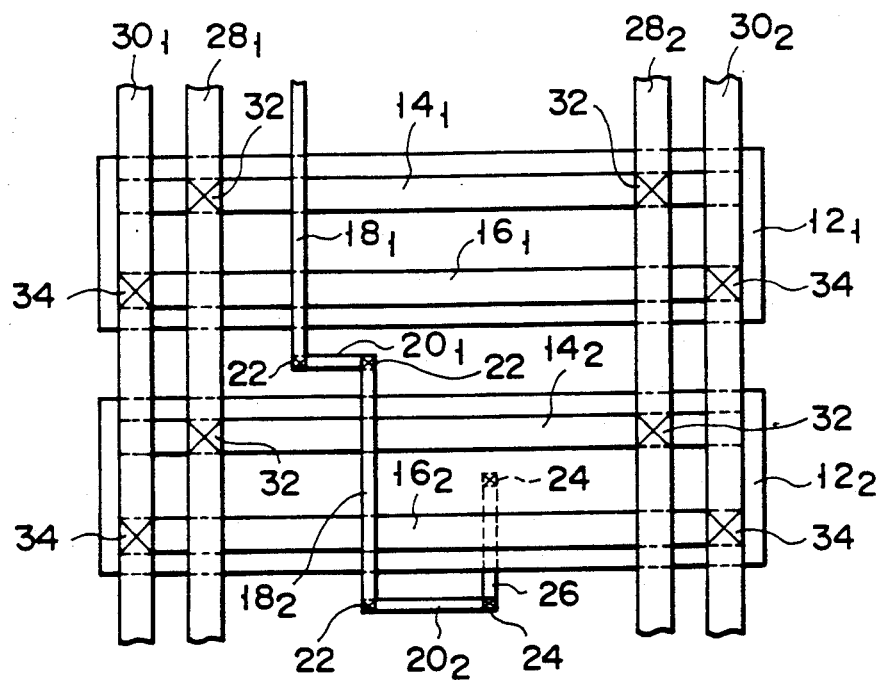
Figure 2:
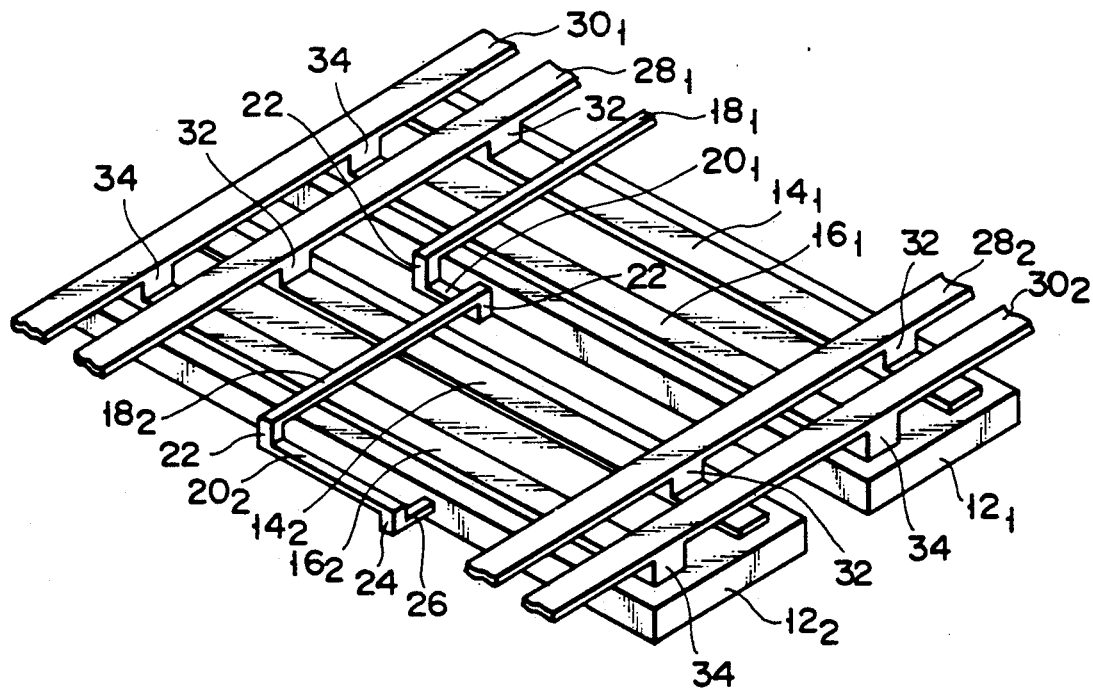
Figure 3:
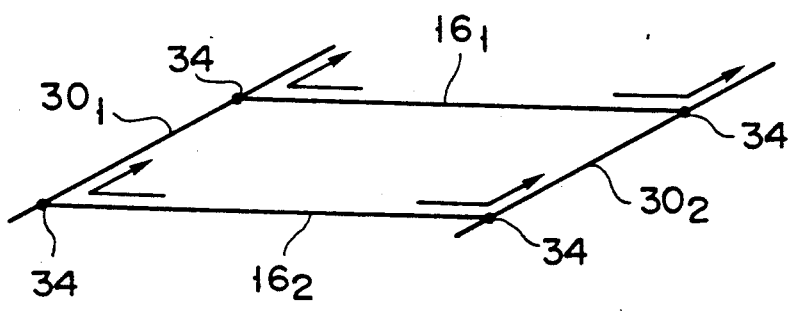
FIG. 3 is a schematic view showing a current path of the semiconductor integrated circuit device of the prior art shown in FIGS. 1 and 2.

A semiconductor device according to preferred embodiments of the present invention will be described hereinafter with reference to the accompanying drawings. Note that the same reference numerals in this embodiment denote the same elements as in the abovementioned prior art, and a description thereof will be omitted.

FIG. 4 is a plan view of a semiconductor integrated circuit device of a standard cell system according to an embodiment of the present invention, and FIG. 5 is a three-dimensional perspective view showing the device in FIG. 4.

The layout of the standard cell system is characterized in that the cells are arranged in a plurality of columns in accordance with cell-connection data, thus forming standard cell arrays. Those regions between any two adjacent arrays is used as a wiring channel. Conductors are formed on the wiring channels, connecting the cells of one array to those of any other array, thus forming logic circuits. For simplicity, only two arrays $12_1$ and $12_2$ of standard cells are illustrated in FIGS. 4 and 5.

In this integrated circuit, Vcc power supply supply lines for supplying a power supply voltage to operate the standard cells in the standard cell arrays $12_1$ and $12_2$, and GND power supply lines to be grounded have the structures described below. In the standard cell arrays $12_1$ and $12_2$, a first aluminum (Al) layer is patterned into a predetermined shape to form prospective Vcc and GND power supply lines. When the standard cells are arranged, the prospective Vcc and GND power supply lines patterned into the predetermined shapes in each standard cell are connected to each other. In other words, by arranging the standard cells, first Vcc power supply lines $14_1$ and $14_2$, and first GND power supply lines $16_1$ and $16_2$ are formed in the first Al layer. Note that the first Al layer is arranged with the power supply lines $16_1$, $16_2$, $14_1$ and $14_2$ lying in a horizontal direction in FIG. 4.

Signal wiring layers connected to each standard cell are constituted by the first Al layer and a second aluminum (Al) layer perpendicular to the first Al layer. For example, the second Al layer is patterned to form first signal lines $18_1$ and $18_2$ to be perpendicular to the first Vcc power supply lines $14_1$ and $14_2$ and the first GND power supply lines $16_1$ and $16_2$. The first Al layer is patterned to form second signal lines $20_1$ and $20_2$ along the standard cell arrays $12_1$ and $12_2$. The second signal lines $20_1$ and $20_2$ are connected to the first signal lines $18_1$ and $18_2$ through via holes 22.

The second signal line $20_2$ is connected to a polysilicon wiring layer 26 through a contact hole 24. The polysilicon wiring layer 26 is connected to one of the standard cells (one standard cell in the standard cell array $12_2$, not shown) having a predetermined logical function. Power supply buses $28_1$, $28_2$, $30_1$, and $30_2$ (to be described later) are used as supply buses for supplying a power supply voltage to operate the standard cells in the standard cell arrays $12_1$ and $12_2$. More specifically, the second Al layer is arranged in a direction perpendicular to the first Vcc power supply lines $14_1$ and $14_2$ and the first GND power supply lines $16_1$ and $16_2$ to form the Vcc power supply buses $28_1$ and $28_2$ and the GND power supply buses $30_1$ and $30_2$. These buses are connected to the first Vcc power supply lines $14_1$ and $14_2$ and the first GND power supply lines $16_1$ and $16_2$ at their ends through via holes 32 and 34.

A third aluminum (Al) layer is patterned to form second power supply lines over the first Vcc power supply lines $14_1$ and $14_2$ and the first GND power supply lines $16_1$ and $16_2$ which are formed of the first Al layer in the above-mentioned standard cell arrays $12_1$ and $12_2$. In other words, second Vcc power supply lines $36_1$ and $36_2$ are formed over the first Vcc power supply lines $14_1$ and $14_2$ from the first layer Al, and second GND power supply lines $38_1$ and $38_2$ are formed over the first GND power supply lines $16_1$ and $16_2$, which also are formed from the first layer Al so that those lines an uppermost layer. In this case, the second Vcc power supply lines $36_1$ and $36_2$ extend along the first Vcc power supply lines $14_1$ and $14_2$, and the second GND power supply lines $38_1$ and $38_2$ extend along the first GND power supply lines $16_1$ and $16_2$.

The first Vcc power supply lines $14_1$ and $14_2$ are connected to the second Vcc power supply lines $36_1$ and $36_2$ through via holes 40. Similarly, the first GND power supply lines $16_1$ and $16_2$ are connected to the second GND power supply lines $38_1$ and $38_2$ through via holes 42. The via hole 40 is located at a substantially center portion of the standard cell array $12_1$, and the via hole 42 is located at a substantially center portion of the standard cell array $12_2$. At this time, the first signal lines $18_1$ and $18_2$ formed of the second Al layer are not arranged below the via holes 40 and 42. Note that a plurality of via holes 40 and 42 may be arranged at positions to connect the first Al layer to the third Al layer.

Figure 6:
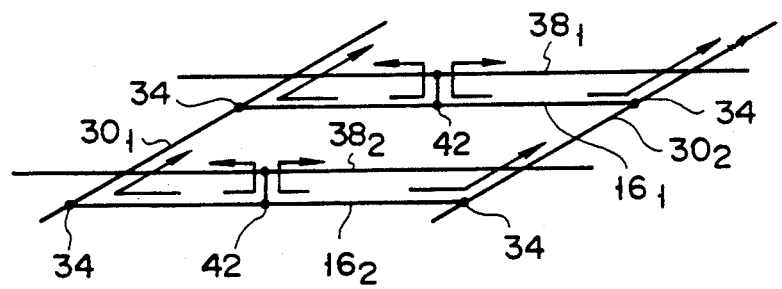
FIG. 6 is a schematic view showing the semiconductor integrated circuit device shown in FIGS. 4 and 5.

FIG. 6 is a schematic view showing a current path of the semiconductor integrated circuit device of this embodiment shown in FIGS. 4 and 5. In FIG. 6, for example, a current from the first GND power supply lines $16_1$ and $16_2$ is supplied to the GND power supply buses $30_1$ and $30_2$ through the via holes 34, and is supplied to the second GND power supply lines $38_1$ and $38_2$ through the via holes 42, as indicated by arrows.

According to the semiconductor integrated circuit device with the above arrangement, therefore, the second Vcc power supply lines $36_1$ and $36_2$ and the second GND power supply lines $38_1$ and $38_2$ are connected to the first Vcc power supply lines $14_1$ and $14_2$ and the first GND power supply lines $16_1$ and $16_2$ in the standard cell arrays $12_1$ and $12_2$, respectively, and hence a current density in the first Vcc power supply lines $14_1$ and $14_2$, and that in the first GND power supply lines $16_1$ and $16_2$ can be decreased. Therefore, in the metal layers which constitute these lines, an adverse effect due to electromigration can be suppressed, thus extending a life of each line. Therefore, there is provided a high-integration, high-reliability semiconductor integrated circuit device having a long circuit life.

Since the second Vcc and GND power supply lines of the third Al layer are formed on the standard cell array along the first Vcc and GND power supply lines in the standard cell array, formation of the first signal lines of the second Al layer arranged on the standard cell array in a direction different from the above direction is not interfered. In addition, the second signal lines can be formed using the third Al layer.

Although the via holes are directly formed from the first Al layer to the third Al layer in this embodiment, the via holes can be formed as follows.

Figure 7:
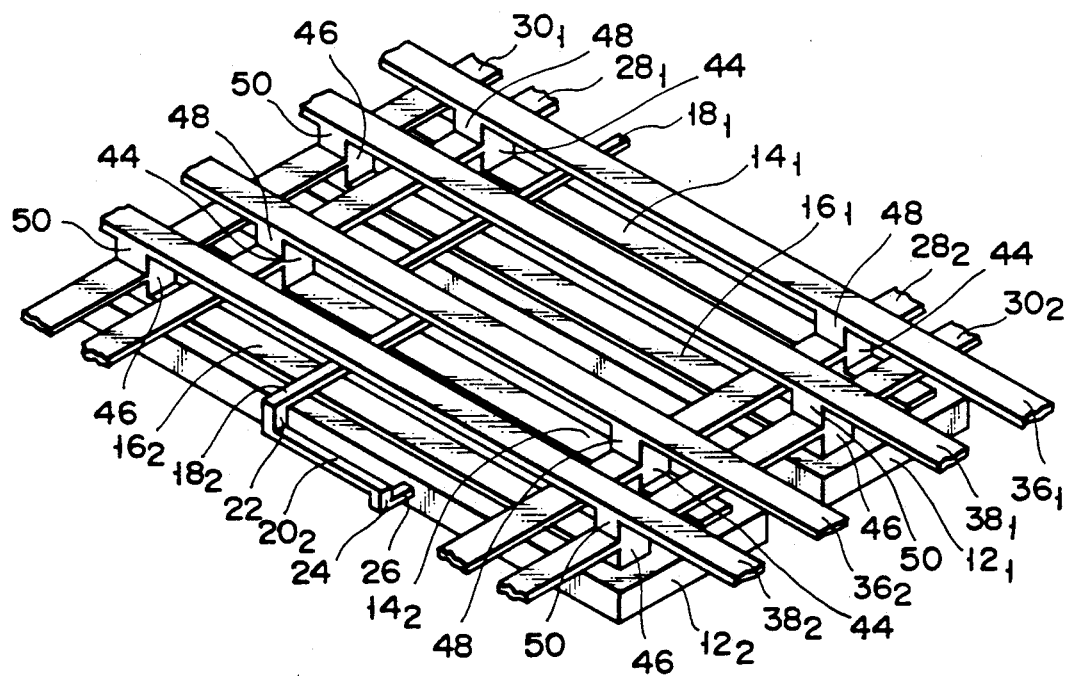
FIG. 7 is a three-dimensional perspective view of a semiconductor integrated circuit device of a standard cell system according to another embodiment of the present invention.

More specifically, as shown in FIG. 7 as a second embodiment, after first via holes 44 and 46 are formed on first Vcc power supply lines $14_1$ and $14_2$ and first GND power supply lines $16_1$ and $16_2$, Vcc power supply buses $28_1$ and $28_2$ and GND power supply buses $30_1$ and $30_2$ are formed as a second Al layer in a direction perpendicular to the first Vcc power supply lines $14_1$ and $14_2$ and the first GND power supply lines $16_1$ and $16_2$. Then, second via holes 48 and 50 are formed on the Vcc power supply buses $28_1$ and $28_2$ and the GND power supply buses $30_1$ and $30_2$. After the second via holes 48 and 50 are formed, second Vcc power supply lines $36_1$ and $36_2$ and second GND power supply lines $38_1$ and $38_2$ are formed above the first Vcc power supply lines $14_1$ and $14_2$ and the first GND power supply lines $16_1$ and $16_2$ as a third Al layer in a direction perpendicular to the Vcc power supply buses $28_1$ and $28_2$ and the GND power supply buses $30_1$ and $30_2$, i.e., along the first Vcc power supply lines $14_1$ and $14_2$ and the first GND power supply lines $16_1$ and $16_2$. Thus, the first Al layer may be connected to the third Al layer through the second Al layer.

Figure 8:
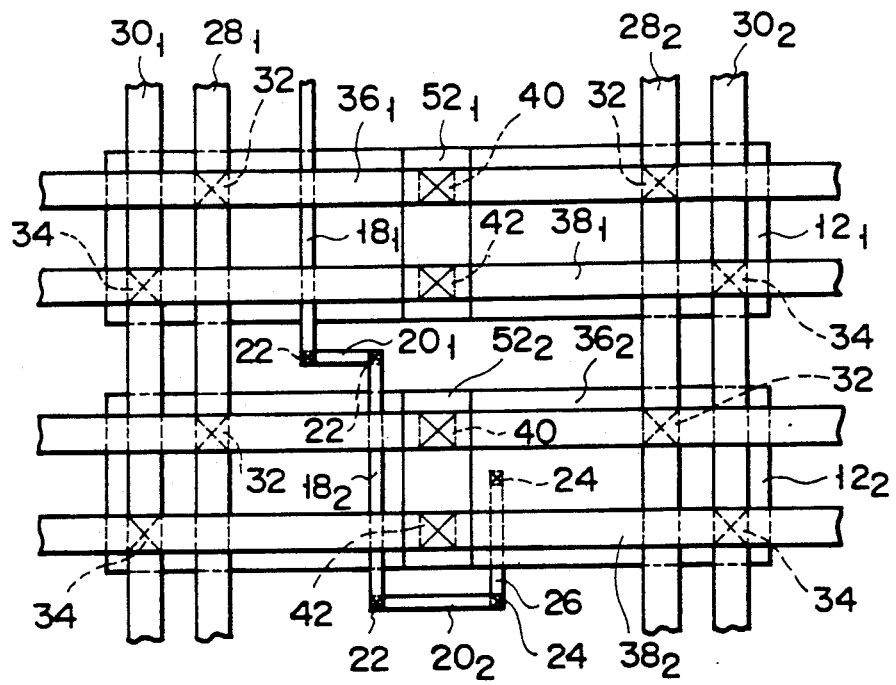
Figure 9:
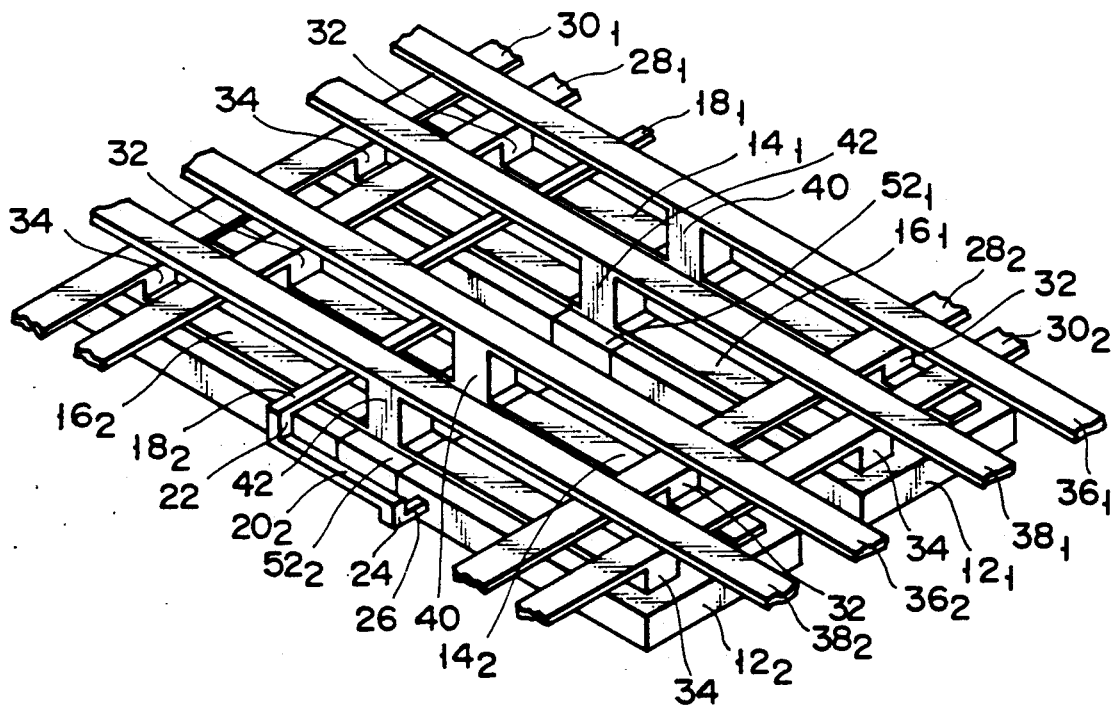

FIGS. 8 and 9 show a semiconductor integrated circuit device of a standard cell system according to still another embodiment of the present invention, in which FIG. 8 is a plan view, and FIG. 9 is a three-dimensional view of the device in FIG. 8. Note that the same reference numerals in FIGS. 8 and 9 denote the same elements in the above-mentioned first embodiment, and a description thereof will be omitted.

In this embodiment, each standard cell is arranged at an optimal position as a result of an automatic placement and routing operation using a computer. Dummy cells $52_1$ and $52_2$ without logical functions are previously buried in positions, at which via holes 40 and 42 will be formed, of each standard cell which constitutes standard cell arrays $12_1$ and $12_2$. In other words, the dummy cells $52_1$ and $52_2$ are arranged to assure positions at which the via holes 40 and 42 will be formed, the via holes 40 and 42 respectively connecting first Vcc power supply lines $14_1$ and $14_2$ to second Vcc power supply lines $36_1$ and $36_2$, and first GND power supply lines $16_1$ and $16_2$ to second GND power supply lines $38_1$ and $38_2$. Each of the dummy cells $52_1$ and $52_2$ arranged at the corresponding optimal position upon the automatic placement and routing operation using the computer.

Note that the first signal lines formed of the second Al layer cannot be arranged above the dummy cells $52_1$ and $52_2$. The opening position is desirably located in a substantially central position of the standard cell arrays $12_1$ and $12_2$. A plurality of dummy cells can be formed to connect the first Al layer to the third Al layer, as a matter of course.

The first Al layer is directly connected to the third Al layer through the via holes in this embodiment. However, as shown in FIG. 7, the first Al layer may be connected to the third Al layer such that the second Al layer is formed after the first via hole is formed, the second via hole is formed in the second Al layer, and the third Al layer is formed, as a matter of course.

What is claimed is:

1. A semiconductor integrated circuit device of a standard cell system, comprising:
   a cell array constituted by linearly arranging a plurality of cells each having a predetermined unit logical function and each having a central portion between respective end portions lying in a first direction;
   a first power supply line, which is connected to each of said cells to supply a power supply voltage to said each cell in said cell array, is formed of a first conductor layer, and elongates in said first direction;

a second power supply line, which is electrically connected to said first power supply line, is formed of a second conductor layer, formed on said first power supply line, and elongates in a second direction, perpendicular to that of said first power supply line, said second power supply line having a first through hole formed at one of said end portions of said cell array for connecting said first and second power lines; and a third power supply line, which is electrically connected to said first power supply line to supply a power supply voltage to each of said cells in said cell array, is formed of a third conductor layer on said second conductor layer, and elongates in a third direction, perpendicular to that of said second power supply line, said third power line having a second through hole formed at the central portion of said cell array for connecting first and third power source lines, wherein said third power supply line is formed on said second power line, above said first power supply line, and said first, second, and third power supply lines are respectively formed in different planes.

2. A device according to claim 1, wherein said first power supply line is directly connected to said second and third power supply lines.

3. A device according to claim 2, further comprising a first signal line, formed of said first conductor layer in the first direction, and a second signal line, formed of said second conductor layer in the second direction, said first and second signal lines being arranged to process signals between said cell arrays, and said second signal line being arranged to elongate between said first and third power supply lines.

4. A device according to claim 2, wherein the first direction, along which said first power supply line elongates, is perpendicular to the second direction along which said second power supply line elongates.

5. A device according to claim 2, wherein the first direction, along which said first power supply line elongates, is identical to the third direction, along which said third power supply line elongates.

6. A device according to claim 2, wherein each of said first, second, and third power supply lines includes a supply line for supplying a power supply voltage, and a feedback line for feeding back a current.

7. A device according to claim 1, wherein said second power supply line is directly connected to said first power supply line, and said third power supply line is directly connected to only said second power supply line.

8. A device according to claim 7, wherein each of said second and third power supply lines has a through hole for connecting power supply lines, and said first and said second power supply lines, and said second and third power supply lines are connected to each other via said through holes.

9. A device according to claim 8, further comprising a first signal line, formed of said first conductor layer in the first direction, and a second signal line, formed of said second conductor layer in the second direction, said first and second signal lines being arranged to process signals between said cell arrays, and said second signal line being arranged to elongate between said first and third power supply lines.

10. A device according to claim 8, wherein said through hole for connecting said first and second power supply lines is formed in an end portion of said cell array.

11. A device according to claim 7, wherein the first direction, along which said first power supply line elongates, is perpendicular to the second direction along which said second power supply line elongates.

12. A device according to claim 7, wherein the first direction, along which said first power supply line elongates, is identical to the third direction, along which said third power supply line elongates.

13. A device according to claim 7, wherein each of said first, second, and third power supply lines includes a supply line for supplying a power supply voltage, and a feedback line for feeding back a current.

* * * * *